United States Patent [19]
Sugiyama et al.

[11] Patent Number: 5,710,529
[45] Date of Patent: Jan. 20, 1998

[54] SURFACE ACOUSTIC WAVE FILER DEVICE HAVING A CASCADE FILTER STRUCTURE AND A PIEZOELECTRIC SUBSTRATE HAVING MIRROR-POLISHED SURFACES

[75] Inventors: Masahiko Sugiyama; Yasufumi Horio; Masatsugu Oshima; Kenji Suzuki, all of Nagoya, Japan

[73] Assignee: NGK Insulators, Ltd., Japan

[21] Appl. No.: 539,254

[22] Filed: Oct. 5, 1995

Related U.S. Application Data

[63] Continuation-in-part of Ser. No. 321,888, Oct. 14, 1994, abandoned.

[30] Foreign Application Priority Data

| Oct. 15, 1993 | [JP] | Japan | 5-258402 |
| Dec. 24, 1993 | [JP] | Japan | 5-328675 |
| Sep. 14, 1994 | [JP] | Japan | 6-220177 |
| Sep. 16, 1994 | [JP] | Japan | 6-221953 |

[51] Int. Cl.$^6$ ................. H03H 9/64; H03H 9/25
[52] U.S. Cl. ................ 333/193; 333/194; 310/313 R
[58] Field of Search ............... 333/193, 194, 333/195, 196; 310/313 R, 313 A, 313 B, 313 C, 313 D

[56] References Cited

U.S. PATENT DOCUMENTS

| 3,675,163 | 7/1972 | Hartmann et al. | 333/30 R |
| 4,004,254 | 1/1977 | DeVries | 333/30 R |
| 4,178,571 | 12/1979 | Mitchell | 333/194 |
| 4,396,851 | 8/1983 | Kishimoto et al. | 310/313 B |
| 4,803,449 | 2/1989 | Hikita et al. | 333/193 |
| 4,939,487 | 7/1990 | Yuhara et al. | 333/193 |
| 5,202,652 | 4/1993 | Tabuchi et al. | 333/193 |

FOREIGN PATENT DOCUMENTS

| 0017467 | 10/1980 | European Pat. Off. | H03H 3/08 |
| 0562876 | 9/1993 | European Pat. Off. | H03H 1/00 |

*Primary Examiner*—Benny T. Lee
*Assistant Examiner*—David Vu
*Attorney, Agent, or Firm*—Parkhurst, Wendel & Burr, L.L.P.

[57] ABSTRACT

A surface acoustic wave filter device includes a piezoelectric substrate having mirror-polished surfaces on both sides, so that it is essentially free from warping. One surface of the substrate is provided with two filter stages which are cascade connected with each other thereby to sufficiently attenuate bulk wave spurious noise below a practically negligible extent. The filter device can be manufactured with an improved yield.

32 Claims, 9 Drawing Sheets

FIG_5

SURFACE ACOUSTIC WAVE FILER DEVICE HAVING A CASCADE FILTER STRUCTURE AND A PIEZOELECTRIC SUBSTRATE HAVING MIRROR-POLISHED SURFACES

CROSS-REFERENCE TO RELATED APPLICATION

This application is a Continuation-In-Part application of U.S. application Ser. No. 08/321,888 filed Oct. 14, 1994, now abandoned.

BACKGROUND OF THE INVENTION

1. Field of the Invention

The present invention relates to a surface acoustic wave (SAW) filter device which may be used to take out a signal within a particular frequency band. More specifically, the invention pertains to a surface acoustic wave filter device which is particularly suitable for improving the manufacturing yield and reducing the spurious noise caused by the bulk wave.

2. Description of the Related Art

Conventionally, there is known and practically used a surface acoustic wave filter device which includes a piezoelectric substrate and interdigital-type transducers (IDTs) on the input and output sides, which are formed on the substrate. Such a filter device typically incorporates unidirectional transducers as the IDTs on the input and output sides, in which a floating electrode is arranged between adjacent positive and negative electrode fingers for reducing an insertion loss of the device.

The surface acoustic wave filter device including unidirectional transducers on input and output sides is disclosed, for example, in Japanese Examined Patent Application Publication No. 3-20,929 (JP-B-3-20,929). This type of surface acoustic wave filter device proved to be highly advantageous in that, besides the reduced insertion loss of the device, it is possible to adequately control the phase- and frequency-characteristics the device. However, known surface acoustic wave filter devices tend to suffer from a problem that a bulk wave transmitted from the input side transducer through inside of the substrate is reflected by its bottom surface and then received by the output side transducer, causing undesirable bulk wave spurious noise to occur the output signal from the output side transducer. In this instance, there may arise various inconveniences particularly when the frequency of the bulk wave spurious noise coincides with an image frequency circuit system which includes the filter device.

A surface acoustic wave filter device developed for reducing the bulk wave spurious noise is disclosed, for example, in Japanese Unexamined Utility Model Application Publication No. 62-201,527 (JP-U-62-201,527). In this instance, the transducers are provided on one side of the piezoelectric substrate and grooves are formed an opposite side of the substrate and are spaced apart from each other at a predetermined pitch, thereby to suppress adverse influences of the bulk wave spurious noise. Another arrangement of the filter device is also known, in which the piezoelectric substrate has been subjected to a surface roughening on its back-side so that the bulk wave transmitted by the input side transducer is scattered over the back-side of the substrate without causing significant bulk wave spurious noise to be added to the output signal from the output side transducer.

However, thorough experimental research and investigations by the inventors led to a recognition that, although the above-mentioned surface roughening or groove formation on the back-side of the substrate does serve to prevent occurrence of the bulk wave spurious noise, such measures are often accompanied by an adverse side effect that it becomes difficult to achieve a satisfactory manufacturing yield of the surface acoustic wave filter device due to undesirable warping of the substrate. Specifically, with reference to a piezoelectric substrate which has been subjected in a conventional manner to a mirror-polish treatment on its surface to be provided with the transducers, it has been found that when the back surface of the substrate on its opposite side is subjected to a surface roughening or groove formation, an intensive stress tends to occur in the substrate causing the entire back surface to contract and thereby inducing a considerable warping of the substrate as s whole. Such warping more or less results in undesirable shifting, from the respectively predetermined design values, of the width and interval of the electrode fingers of the transducers which are formed in the subsequent lithography process. In this instance, the insertion loss of the filter device increases or the group delay time (GDT) deteriorates, thereby giving rise to a considerably poor manufacturing yield of the filter device. Particularly in the case of unidirectional transducers wherein floating electrode fingers are arranged between adjacent positive and negative electrode fingers, a very strict accuracy is required for the width and interval of the electrode fingers and it is therefore desirable to eliminate adverse influences of the warping of the substrate. Besides, in the case of surface acoustic wave filter devices including unidirectional transducers, it is also desirable to further reduce the insertion loss of the device as well.

DISCLOSURE OF THE INVENTION

A primary object of the present invention is to provide a surface acoustic wave filter device capable of improving the manufacturing yield and reducing the bulk wave spurious noise.

Another object of the present invention is to provide a surface acoustic wave falter device capable of further reducing the insertion loss of the device.

According to one aspect of the present invention, there is provided a surface acoustic wave filter device which comprises a piezoelectric substrate having first and second surfaces opposite to each other, the first and second surfaces each being a mirror-polished surface, and first and second filter stages formed on the first surface of the piezoelectric substrate, respectively, each having an interdigital-type unidirectional input side transducer and an interdigital-type unidirectional output side transducer. The input side and output side transducers of the first and second filter stages are arranged so that surface acoustic waves transmitted from the input side transducers propagate toward the respective output side transducers in a predetermined common direction along respective propagation axes which are in parallel with each other. Furthermore, the input side and output side transducers of the first and second filter stages each includes at least a positive electrode having a plurality of electrode fingers, and a negative electrode having a plurality of electrode fingers which are arranged between adjacent electrode fingers of the positive electrode, the positive electrode of the output side transducer of the first filter stage and the positive electrode of the input side transducer of the second filter stage being connected with each other.

The above-mentioned arrangement of the present invention proved to highly effectively prevent warping of the piezoelectric substrate due to formation of the second surface or back surface of the substrate as a mirror-polished surface, like the first surface provided thereon with the transducers. Such mirror-polished surfaces of the substrate serve to prevent a contraction force from being generated in the substrate, thereby allowing a precise and accurate formation, by an appropriate lithography treatment, of the transducers on the flat surface of the substrate without warping.

According to the present invention, furthermore, in order to eliminate or mitigate the adverse effect of the bulk wave spurious noise, a two-stage cascade coupling is employed as an arrangement of the transducers, wherein the two filter stages (i.e., the first and second filter stages) are formed on the same substrate and the signals filtered by the first filter stage are applied to the second filter stage to twice perform the filtering. In other words, the two filter stages are cascade connected in a single surface acoustic wave filter device and the resultant attenuation characteristic corresponds to the product of the respective attenuation characteristics of the two stages. It is therefore readily possible to significantly attenuate the bulk wave spurious noise and to take out output signals in which the spurious noise is attenuated down to a negligibly small level. Consequently, there can be realized a surface acoustic wave filter device capable of further improving the manufacturing yield and satisfactorily suppressing the bulk wave spurious noise.

Advantageously, the input side and output side transducers of the first and second filter stages each includes a positive electrode having a plurality of electrode fingers which are arranged at a pitch $\lambda$, where $\lambda$ is a wavelength of a fundamental surface acoustic wave, a negative electrode having a plurality of electrode fingers which are arranged at a pitch $\lambda$ and positioned at a center distance $\lambda/2$ with an adjacent electrode finger of the positive electrode, and a floating electrode having a plurality of electrode fingers each being arranged between adjacent electrode fingers of the positive and negative electrodes and offset from an intermediate position between the adjacent electrode fingers of the positive and negative electrodes in a direction opposite to the propagation direction of the surface acoustic wave in the case of the floating electrode of the input side transducers, and in the propagation direction of the surface acoustic wave in the case of the floating electrode of the output side transducers of the first and second filter stages.

In this instance, preferably, each electrode finger of the floating electrode of the input side and output side transducers of each filter stage is shifted from an intermediate position between an adjacent electrode finger of the positive electrode and an adjacent electrode finger of the negative electrode finger, by a distance $\lambda/12$ in the direction opposite to the propagation direction of the surface acoustic wave In the case of the floating electrode of the input side transducers, and by a distance $\lambda/12$ in the propagation direction of the surface acoustic wave in the case of the floating electrode of the output side transducers, and wherein each electrode finger of the positive electrodes, negative electrodes and floating electrodes of the input side and output side transducers of each filter stage has a width "w" as measured in the propagation direction of the surface acoustic wave, said width satisfying the following equations:

$$1.0 \times \lambda/12 \leq w < 1.5 \times \lambda/12.$$

A two-stage cascade type surface acoustic wave filter device is particularly advantageous in that a higher out-of-band attenuation degree can be realized to significantly reduce the bulk wave spurious noise, though the insertion loss of the device tends to becomes higher. It is thus preferable to constitute the transducer so that the insertion loss can be reduced as far as possible.

In order to reduce the insertion loss of the device, each floating electrode of the input side and output side transducers is advantageously arranged so that it is significantly shifted from an intermediate position between adjacent positive electrode and negative electrode fingers. Such an asymmetric structure of the transducers makes it readily possible to enhance the unidirectional propagation of the surface acoustic wave. It has been found in this connection that, when the electrode finger has a width which is less than $\lambda/8$, the shift amount of the floating electrode from the intermediate position is insufficient to effectively enhance the unidirectionality due to the asymmetrical structure of the transducers. Thus, preferably, the width of each electrode finger is not less than $\lambda/8$ (=$1.5 \times \lambda/12$) and the floating electrode is shifted from the intermediate position between the adjacent positive and negative electrode fingers, by a distance $\lambda/12$ in the direction opposite to the propagation direction of the surface acoustic wave in the case of the floating electrode of the input side transducers, and by a distance $\lambda/12$ in the propagation direction of the surface acoustic wave in the case of the floating electrode of the output side transducers.

Moreover, various experiments and analyses by the inventors revealed that an extremely effective method of reducing the insertion loss of the device is to positively utilize a mechanical perturbation effect by the electrode finger of the transducer. The mechanical perturbation effect can be positively utilized by increasing the width of the electrode finger as seen in the propagation direction of the surface acoustic wave. In this connection, as will be more fully described hereinafter, it has been confirmed that an increased width of the electrode finger serves to effectively reduce the insertion loss of the device, though an increase in the width of the electrode finger more or less deteriorates the GDT characteristic of the device. Thus, the lower and upper limits of the electrode finger width are respectively determined by the insertion loss and the GDT characteristic. According to a comprehensive experimental analysis, it has been found that the electrode finger width within the range described above satisfactorily meets with practical user's standard for both the insertion loss and the GDT characteristic of the device.

Advantageously, the piezoelectric substrate is formed of quartz or an appropriate piezoelectric material having an electromechanical coupling coefficient which is substantially the same as that of quartz, and the floating electrode of the input side and output side transducers of each filter stage is a short-circuit-type floating electrode. The quartz substrate has a very small frequency variation range for temperature change, so that the use of the quartz substrate as the piezo-electric substrate enables a variation of the frequency band due to the temperature change to be maintained within a very small range. However, due to a low electromechanical coupling coefficient of quartz, it is practically Impossible, from the viewpoint of the insertion loss, to use the filter device including a quartz substrate in combination with conventional transducers as they are. Further investigations on the insertion loss of the device including a quartz substrate revealed that the sign of reflection coefficient of the floating electrode intensively affects on the insertion loss. Furthermore, in the case of a quartz substrate, a short-circuit type floating electrode has a reflection coefficient which is higher than that of an open type floating electrode. It is therefore preferable to use only the short-circuit type as the floating electrode of the surface acoustic wave filter device. The short-circuit type floating electrode as the floating electrode of the filter device makes it possible to suppress the insertion loss within an extremely small range even when the piezoelectric substrate is formed of quartz having a small electromechanical coupling coefficient, and hence so realize a narrow band surface acoustic wave filter device having a low insertion loss and an excellent temperature characteristic.

Advantageously, the input side transducer of the first filter stage has a bus bar of the positive electrode, which is directly opposite to one side edge of the piezoelectric substrate, and the output side transducer of the second filter stage has a bus bar of the positive electrode, which is directly opposite to the opposite side edge of the piezoelectric substrate.

As s result of thorough experiments and analysis conducted by the inventors with reference to the two-stage cascade coupling type surface acoustic wave filter device, it has been recognized to be important to arrange the output side transducer of the first filter stage and the input side transducer of the second filter stage spaced from each other by as large a distance as possible, thereby to prevent an electromagnetic coupling between the two transducers in question. That is to say, when the output side transducer of the first filter stage is arranged close to the input side transducer of the second filter stage, an electromagnetic coupling occurs between those transducers, thereby not only raising the noise level and out-of-band attenuation level, but also degrading the phase- and frequency-characteristics of the device. Based on such a recognition, according to the present invention, it is advantageous to arrange the output side transducer of the first filter stage and the input side transducer of the second falter stage such that their positive electrodes are spaced from each other by as large a distance as possible.

Another effective approach for preventing undesirable electromagnetic coupling between the transducers of the first falter stage and those of the second filter stage is to arrange a guard electrode between the first and second filter stages. As mentioned above, the two-stage cascade connection of the two filter stages tends to induce an electromagnetic coupling between the transducers of the first stage and the transducers of the second stage. However, by arranging the guard electrode between the first and second filter stages and connecting the guard electrode to ground, it is readily possible to solve the problem unique to the two-stage cascade connection type surface acoustic wave filter device and to thereby effectively achieve the desired filter performance of the device.

Advantageously, a sound absorbing material layer is formed between the first and second filter stages so that a surface acoustic wave transmitted from the input side transducer of one of the filter stages is prevented from being received by the output side transducer of the other of the filter stages. For each filter stage, the surface acoustic wave transmitted from the input side transducer propagates toward the output side transducer while expanding in a direction orthogonal to the propagation direction. Thus, when the two filter stages are arranged adjacent to each other, the surface acoustic wave transmitted from the input side transducer of one of the filter stages may be received by the output side transducer of the other of the filter stages, thereby raising the noise level. On the other hand, an increased distance between the first and second filter stages often results in difficulties in realizing a compact arrangement of the device. The sound absorbing material layer between the two filter stages positively serves to prevent the surface acoustic wave transmitted from one filter stage from being received by another filter stage, without increasing the distance between the two filter stages, thereby solving the particular problem of the two-cascade type surface acoustic wave filter device.

Further advantageously, the positive electrode of the output side transducer of the first filter stage and the positive electrode of the input side transducer of the second filter stage are connected with each other by at least one bonding wire. Such a bonding wire has a small resistance value and thus effectively cooperates with an inductor to cancel the capacitance component of the transducer and provide a low insertion loss of the device as a whole. The connection of the relevant positive electrodes by the bonding wire also makes it possible to realize a compact arrangement of the device and minimizes adverse influence of noise from the substrate to further improve the filter performance.

Particularly when the guard electrode is arranged between the first and second filter stages, as mentioned above, the bonding wire connecting the output side transducer of the first filter stage and the input side transducer of the second filter stage not only prevents the electromagnetic coupling between the two filter stages, but also prevent noise from entering from the substrate. It is thus possible to solve the problem unique to the two-stage cascade connection type filter device and to significantly improve the filter performance of the device.

Preferably, the surface acoustic wave filter device according to the present invention further comprises a package containing the piezoelectric substrate therein and having a bonding pad which is connected, by first and second bonding wires, respectively, to the positive electrode of the output side transducer of the first filter stage and the positive electrode of the input side transducer of the second filter stage. In this instance, the bonding pad may be positioned on a substantially intermediate point of the package in the propagation direction of the surface acoustic wave, and the first and second bonding wires may be substantially the same in length. Furthermore, the positive electrode of each transducer of each filter stage may have a bus bar, with the first and second bonding wires coupled to an intermediate point, in the propagation direction of the surface acoustic wave, of the bus bar of each positive electrode.

In the two-stage cascade connection type surface acoustic wave filter device, it is necessary to connect an inductance between the first filter stage and the second filter stage to cancel the capacitance component of the transducers. In this instance, when the output side transducer of the first filter stage and the input side transducer of the second filter stage are not properly balanced with each other with reference to the connecting point of the inductance, the inductance may not effectively achieve the intended function. More particularly, when there is difference in the resistance component, capacitance component and/or reactance component between the connecting line from the connecting point of the inductance to the output side transducer of the first filter stage, on one hand, and the connecting line from the connecting point of the inductance to the input side transducer of the second filter stage, on the other hand, the capacitance component of the transducers may not be effectively cancelled with the result that it becomes difficult to lower the insertion loss of the filter device. For such a reason, it is particularly desirable to arrange the transducers so that the output side transducer of the first filter stage and the input side transducer of the second filter stage are electrically balanced with reference to the connecting point of the inductance.

Thus, in order to achieve a well balanced relationship between the output side transducer of the first filter stage and the input side transducer of the second filter stage, it is advantageous to provide the package with a bonding pad at the intermediate point in the propagation direction of the surface acoustic wave, so that the boding pad serves as a reference point for connecting the output side transducer of the first filter stage and the input side transducer of the second filter stage. In this instance, the electrical characteristics of the connecting lines from the connecting point of the inductance to the respective transducers can be made substantially equal to each other to significantly reduce the insertion loss of the device. In many instances, it is advantageous to connect the output side transducer of the first filter stags and the input side transducer of the second filter stage by means of at least one bonding wire. This is because the bonding wire has a low resistance value and is capable of reducing the insertion loss of the device, providing an improved degree of freedom in the design and arrangement of the transducers of the first and second filter stages, and realizing a compact arrangement of the device due to a close arrangement of the two filter stages.

Alternatively, however, the output side transducer of the first filter stage and the input aide transducer of the second filter stage may be connected with each other by means of a conductive pattern in the form of an aluminum thin film formed on the piezo-electric substrate. In this instance, it is preferable for the conductive pattern to have a thickness which is within a range of 0.3–0.7 μm and which is two to four times greater than that of the electrode finger.

BRIEF DESCRIPTION OF THE DRAWINGS

The present invention will now be explained in further detail hereinafter, with reference to certain preferred embodiments shown in the accompanying drawings, in which.

DETAILED DESCRIPTION OF THE PREFERRED EMBODIMENTS

Figure 1:
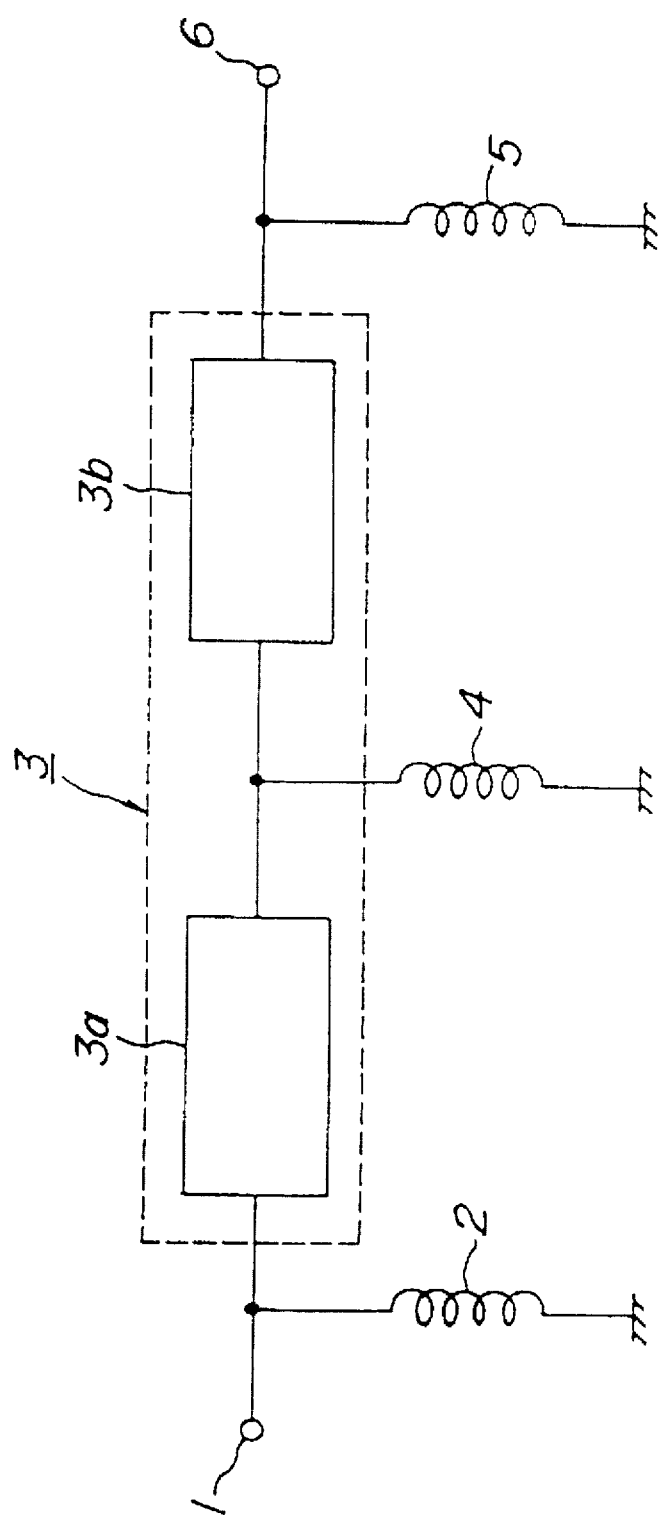
FIG. 1 is an equivalent circuit diagram of the filter circuit comprising the surface acoustic wave filter device according to the present invention.

Referring now to FIG. 1, there is shown an equivalent circuit diagram of a filter circuit which includes a surface acoustic wave filter device according to the present invention. The filter circuit includes an input terminal 1 which can be supplied with an input signal to be filtered. The input terminal i is connected to a first inductor 2 and a surface acoustic wave filter device 3. According to the present invention, the surface acoustic wave filter device 3 is a two-stage filter device including a first filter stage 3a and a second filter stage 3b which are cascade connected with each other. Thus, the input signal supplied to the input terminal 1 of the filter circuit is subjected to a two stage filtering. A second inductor 4 is connected across the first filter stage 3a and the second filter stage 3b for canceling the capacitance component of transducers included in the filter stages the surface acoustic wave filter device 3 has an output which is connected to a third inductance 5 and also to an output terminal 6 of the filter circuit, from which the filtered signal is taken out.

Figure 2:
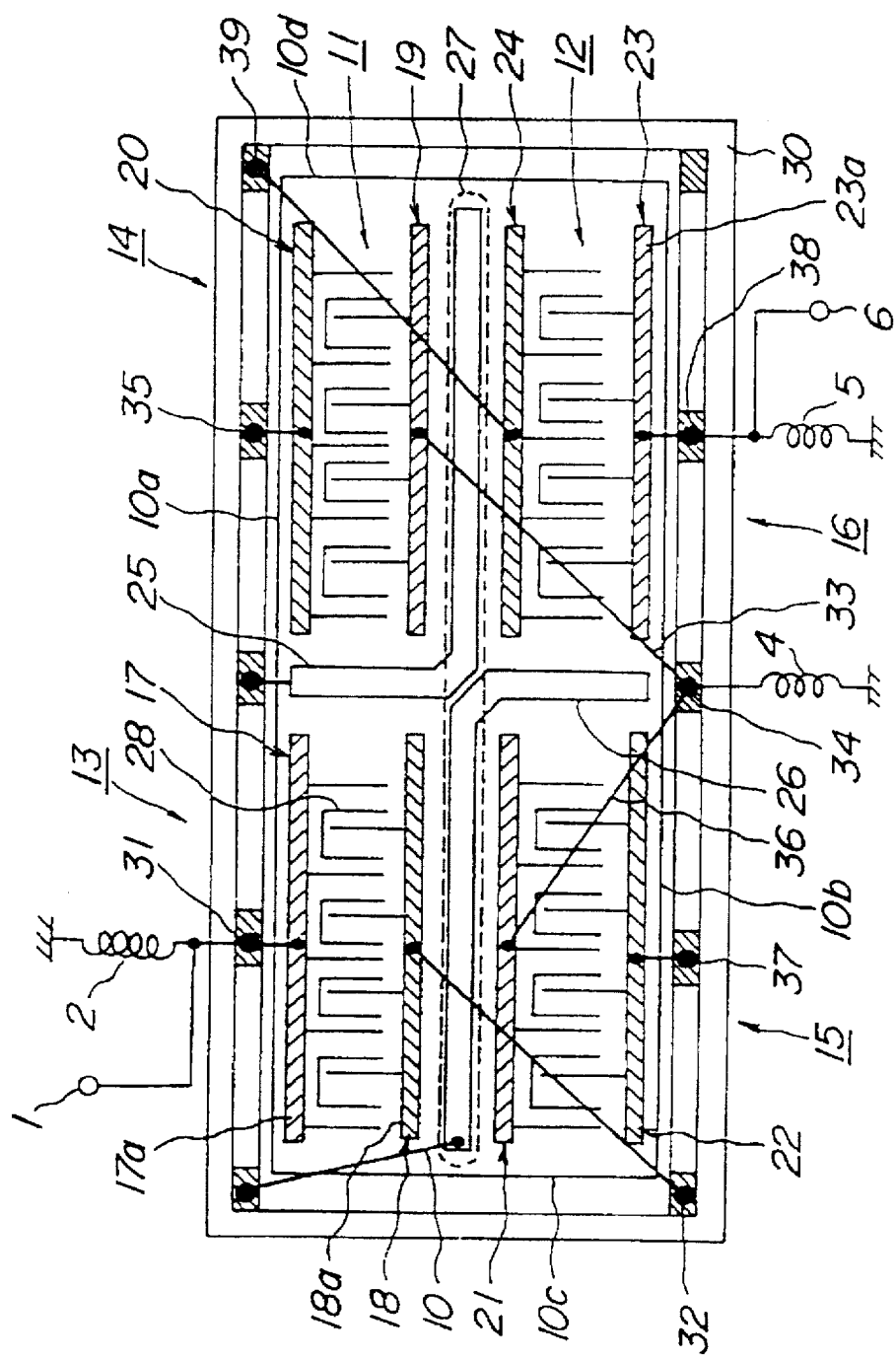
FIG. 2 is a schematic plan view showing one embodiment of the surface acoustic wave filter device according to the invention.

FIG. 2 is a schematic plan view showing one embodiment of the surface acoustic wave filter device according to the present invention, which is suitable for the filter circuit shown in FIG. 1. The surface acoustic wave filter device includes a piezoelectric substrate 10 which comprises a generally rectangular quartz substrate. A quarts substrate exhibits a very small frequency fluctuation in response to a temperature change, and is thus capable of minimizing the fluctuation of the frequency pass band width under a variable temperature condition.

The piezoelectric substrate 10 has first and second surfaces which are opposite to each other. In the present embodiment shown, the first and second surfaces of the piezoelectric substrate 10 are mirror-polished. The first surface of the piezoelectric substrate 10 is formed thereon with first and second filter stages 11, 12. The first filter stage 11 includes an input side transducer 13 and an output side transducer 14. Similarly, the second filter stage 12 includes an input side transducer 15 and an output side transducer 16. The four transducers 13 to 16 are formed of interdigital-type unidirectional transducers having the same construction.

The input side transducer 13 of the first filter stage 11 includes a positive electrode 17 having a plurality of electrode fingers, a negative electrode 18 having a plurality of electrode fingers each being arranged between adjacent electrode fingers of the positive electrode, and a floating electrode 28 having a plurality of electrode fingers arranged between adjacent electrode fingers of the positive and negative electrodes 17, 18. Each electrode finger of the positive electrode 17, negative electrode 18 and floating electrode 28 has a width which, for example, is 1.3×λ/12, where λ represents the wavelength of the fundamental surface acoustic wave. The electrode fingers of the positive electrode 17 are arranged at a pitch λ, and the electrode fingers of the negative electrode 18 are also arranged at the pitch λ. The center distance between a positive electrode finger and an adjacent negative electrode finger is λ/2. Each electrode finger of the floating electrode 28 is shifted by λ/12, from an intermediate position between adjacent positive electrode and negative electrode, to an upstream side of the propagation direction of the surface acoustic wave. It is therefore possible to further enhance the desired unidirectionality characteristic due to an asymmetrical arrangement of the relevant electrode fingers.

Since, as mentioned above, the four transducers 13–16 are basically of the same construction, the output side transducer 14 of the first filter stage 11 includes a positive electrode 19 and a negative electrode 20 each having I plurality of electrode fingers, and a floating electrode arranged between adjacent electrode fingers of the positive and negative electrodes 19, 20. The input side transducer 15 of the second filter stage 12 includes a positive electrode 21 and a negative electrode 22 each having a plurality of electrode fingers, and a floating electrode arranged between adjacent electrode fingers of the positive and negative electrodes 21, 22. The output side transducer 16 of the second filter stage 12 includes a positive electrode 23 and a negative electrode 24 each having a plurality of electrode fingers, and a floating electrode arranged between adjacent electrode fingers of the positive and negative electrodes 23, 24. The number of pairs of electrode fingers for each transducer 13 to 16 is all set to the same number, and the input and output sides are balanced with each other with reference to the intermediate point of the first and second filter stages 11, 12.

The transducers 13 to 16 of the first and second filter stages 11, 12 are arranged so that the surface acoustic wave in the first filter stage 11 and the surface acoustic wave in the second filter stage 12 propagates in a common propagations direction, along the respective propagation axes which are in parallel with each other. The first and the second filter stages 11, 12 are arranged so that they are juxtaposed with each other in a direction orthogonal to the propagation direction of the surface acoustic wave.

As for the first filter stage 11, the input side transducer 13 includes s bus bar 17a of the positive electrode 17, which is arranged directly opposite to a side edge 10a of the substrate 10. The output side transducer 14 has an inverted arrangement of the positive and negative electrodes 19, 20 with reference to the input side transducer 13. Thus, the output side transducer 14 has a bus bar of the negative electrode 20, which is arranged directly opposite to the same side edge 10a of the substrate 10. Similarly, as for the second filter stage 12, the input side transducer 15 includes a bus bar of the negative electrode 22 which is arranged directly opposite to another side edge 10b of the substrate 10. The output side transducer 16 has an inverted arrangement of the positive and negative electrodes 23, 24 with reference to the input side transducer 15. Thus, the output side transducer 16 has a bus bar 23a of the positive electrode 23, which is arranged directly opposite to the same side edge 10b of the substrate 10.

With such an arrangement of the positive and negative electrodes of the transducers 13–16, the positive electrode 17 of the input side transducer 13 of the first filter stage 11 and the positive electrode 23 of the output side transducer 16 of the second filter stage 12 can be arranged with a maximum distance therebetween, so that it is possible to effectively prevent undesirable electromagnetic coupling between the input side transducer 13 of the first filter stage 11 and the output side transducer 16 of the second filter stage 12.

For further positively preventing electromagnetic coupling between the transducers of the first and second filter stages 11, 12, there may be provided guard electrodes 25, 26 between the two filter stages 11, 12. The guard electrodes 25, 26 in the illustrated embodiment each has a substantially L-shaped configuration, respectively, so that those regions of the guard electrodes 25, 26 which extend between the input side transducers 13, 15 and the output side transducers 14, 16 each constitutes a shield electrode. By preventing the electromagnetic coupling by means of the guard electrodes 25, 26 between the first and second filter stages 11, 12 as described above, it is possible to provide a considerably improved side lobe characteristic of the filter device. The guard electrodes 25, 26 are grounded through bonding pads formed on the package.

In the illustrated embodiment, a sound absorbing material layer 27 is coated between the first filter stage 10 and the second filter stage 11 on the quartz substrate 10, as shown by dotted lines in FIG. 2. The sound absorbing material layer 27 prevents the surface acoustic wave transmitted from the input side transducer 13 of the first filter stage 11 from being received by the output side transducer of the second filter stage 12, thereby to prevent generation of noise and improve the attenuation characteristic of the filter device. Although the surface acoustic wave propagates while expanding on the surface region of the quartz substrate 10, the sound absorbing material layer 27 between the first and second filter stages 11, 12 effectively prevents the surface acoustic wave transmitted by one of the filter stages from being received by another filter stage. It is therefore possible to effectively suppress generation of noise and to readily realize a compact arrangement of the two-stage cascade coupling type surface acoustic wave filter device having a reduced distance between the filter stages.

The provision of both of the guard electrodes 25, 26 and the sound absorbing material layer 27 serves to effectively prevent electromagnetic coupling and mixture of the surface acoustic wave between the two filter stages, and further makes it possible to significantly improve the attenuation- and frequency-characteristics in the two stage cascade connection type surface acoustic wave filter device. In the present embodiment, furthermore, the substrate 10 may be coated with sound absorbing material along the side edges 10a, 10b and/or longitudinal edges 10c, 10d, for preventing the surface acoustic wave from being reflected at the edges 10a–10d of the substrate 10, which may otherwise be incident on the transducers as noise.

The substrate 10 may be accommodated within, and supported by a package 30. In the illustrated embodiment, the package 30 includes a plurality of bonding pads through the electrodes of the respective transducers are connected with each other or connections to a printed circuit board. The connections between the electrodes of the transducers and the respective bonding pads are performed by bonding wires. The bonding wire has a relatively low resistance value and is thus capable of effectively improving the out-of-band attenuation degree of the filter device. The connection of the electrodes of the transducers and the boding pads by means of the bonding wire serves to reduce the surface area of the substrate and thereby realize a compact arrangement of the filter device. It should be further noted that an optional position of the bus bar of an electrode can be connected to the bonding pad and the bonding pad can be formed on the package at an optional position, so that it is possible to considerably improve the degree of freedom of connection. In particular, because the transducing characteristic of each transducer and the characteristics of the filter device as a whole have a close relationship with the positions of connecting points for each electrode, a higher degree of freedom of connection is important for improving the performance of the filter device.

As particularly shown in FIG. 2, the bonding wire has one end which is connected to the substantially intermediate position, as seen in the propagation direction of the surface acoustic wave, of the bus bar of the relevant electrode. This is due to the following consideration. That is, when the bus bar of the electrode is connected to the bonding pad with the end of the bus bar as a connecting point, the bonding wires on both sides of the bonding pad will be significantly different from each other, in terms of their length and capacitance component. The difference in the capacitance component of the bonding wires cannot be effectively cancelled by an external inductance, and thus causes the insertion loss characteristic of the filter device to deteriorate. In contrast, when the bonding pad is connected to the bus bar of the electrode with the intermediate position of the bus bar as a connecting point, it is possible to transduce an averaged signal over an entire transducer, there can be transduced a satisfactorily reproduced signal in conformity with a design value. For this reason, it is highly advantageous to connect the bonding wire to the intermediate position of the bus bar of the electrode as a connecting point, with respect to all the electrodes of the tansducers.

As for the first filter stage 11, the positive electrode 17 of the input side transducer 13 is connected to a bonding pad 31 by a bonding wire. To this end, the bonding wire on its one end is connected to the intermediate position, in the propagation direction of the surface acoustic wave, of the bus bar 17a of the positive electrode 17. The bonding pad 31 is arranged directly opposite to the intermediate position of the bus bar 17a. The negative electrode 18 of the input aide transducer 13 is connected to a bonding pad 32 arranged on the lower left corner of the package 30 as seen in FIG. 2, by a bonding wire. Thus, the bonding wire on its one end is connected to the intermediate position of the bus bar 18a of the negative electrode 18. The positive electrode 19 of the output side transducer 14 is connected to a bonding pad 34 through a bonding wire 33, and the negative electrode 20 thereof is connected to a bonding pad 35 through a bonding wire. The bonding pad 35 is arranged directly opposite to the intermediate position of the bus bar of the negative electrode 20. In this case also, the bonding wires 33 are respectively connected on their one ends to the intermediate positions of the bus bars of the positive and negative electrodes 19, 20. The bonding pad 34 connected to the positive electrode 19 is arranged at the intermediate position, in the propagation direction of the surface acoustic wave, of the package 30.

Similarly, as for the second filter stage 12, the positive electrode 21 of the input side transducer 15 is connected to the bonding pad 34 through a bonding wire 36, and the negative electrode 22 thereof is connected to a bonding pad 37. In this case, the bonding wire 35 on its one end is connected to the intermediate position of bus bar of the positive electrode 21. The bonding pad 37 is arranged directly opposite to the intermediate position of the bus bar of the negative electrode 22. The positive electrode 23 of the output side transducer 16 is connected to s bonding pad 38 arranged directly opposite to the intermediate position of the bus bar of the positive electrode 23. The bonding pad 38 is connected to the output terminal 6 of the filter circuit, from which the filtered signal can be taken out. The negative electrode 24 of the output side transducer 16 is connected to a bonding pad 39 arranged at the upper right corner of the package 30.

Thus, according to the embodiment shown in FIG. 2, the positive electrode 19 of the output side transducer 14 of the first filter stage 11 and the positive electrode 21 of the input side transducer 15 of the second filter stage 12 are connected with each other through the bonding wire 33, bonding pad 34 and bonding wire 36. In this connection, the bonding pad 34 is arranged at the intermediate position of the package 30 in the propagation direction of the surface acoustic wave, so that the length of the bonding wire 33 and the length of the bonding wire 36 can be made substantially equal to each other. As a result, the resistance, capacitance and reactance components of the first filter stage 11 and those of the second filter stage 12 can be made substantially equal to each other, with reference to the connecting point of the inductance 4. Therefore, the first and second filter stages 11, 12 can be balanced with each other, and the inductance 4 connected between the two filter stages 11, 12 is capable of achieving the intended function and thereby significantly reducing the insertion loss of the filter device.

Although the bonding wires 33, 36 on both sides of the bonding pad 34 may appear in the drawing as being slightly different from each other in their length, this is mainly due to an exaggerated representation. In an actual arrangement of the filter device, the distance between the first and second filter stages 11, 12 ie as small as 0.5 mm or less, so that the lengths of the bonding wires 33, 36 can be assumed to be practically equal to each other.

In the illustrated embodiment, the bonding wire for connecting the negative electrode 20 of the output side transducer 14 of the first filter stage 11 to the bonding pad 35 has a length which is equal to that of the bonding wire for connecting the negative electrode 22 of the input side transducer 15 of the second falter stage 12 to the bonding pad 37. Therefore, the ground side conductors for connecting the first and second filter stages 11, 12 are also substantially equal to each other with respect to the resistance, capacitance and reactance components, making it possible to significantly improve the out-of-band attenuation characteristic of the filter device. The bonding pads 35, 37 may be connected to each other within the package 30, through a conductor pattern (not shown) formed inside the package.

With the above-mentioned construction of the surface acoustic wave filter device, the first and second filter stages 11, 12 can be balanced with each other so as to form a mirror image relationship with reference to the intermediate point therebetween. Consequently, it is possible to significantly reduce the insertion loss of the device and provide an improved out-of-band attenuation characteristic.

The electrode finger of each transducer has a width in the propagation direction of the surface acoustic wave, which is determined in view of following considerations.

Figure 3:
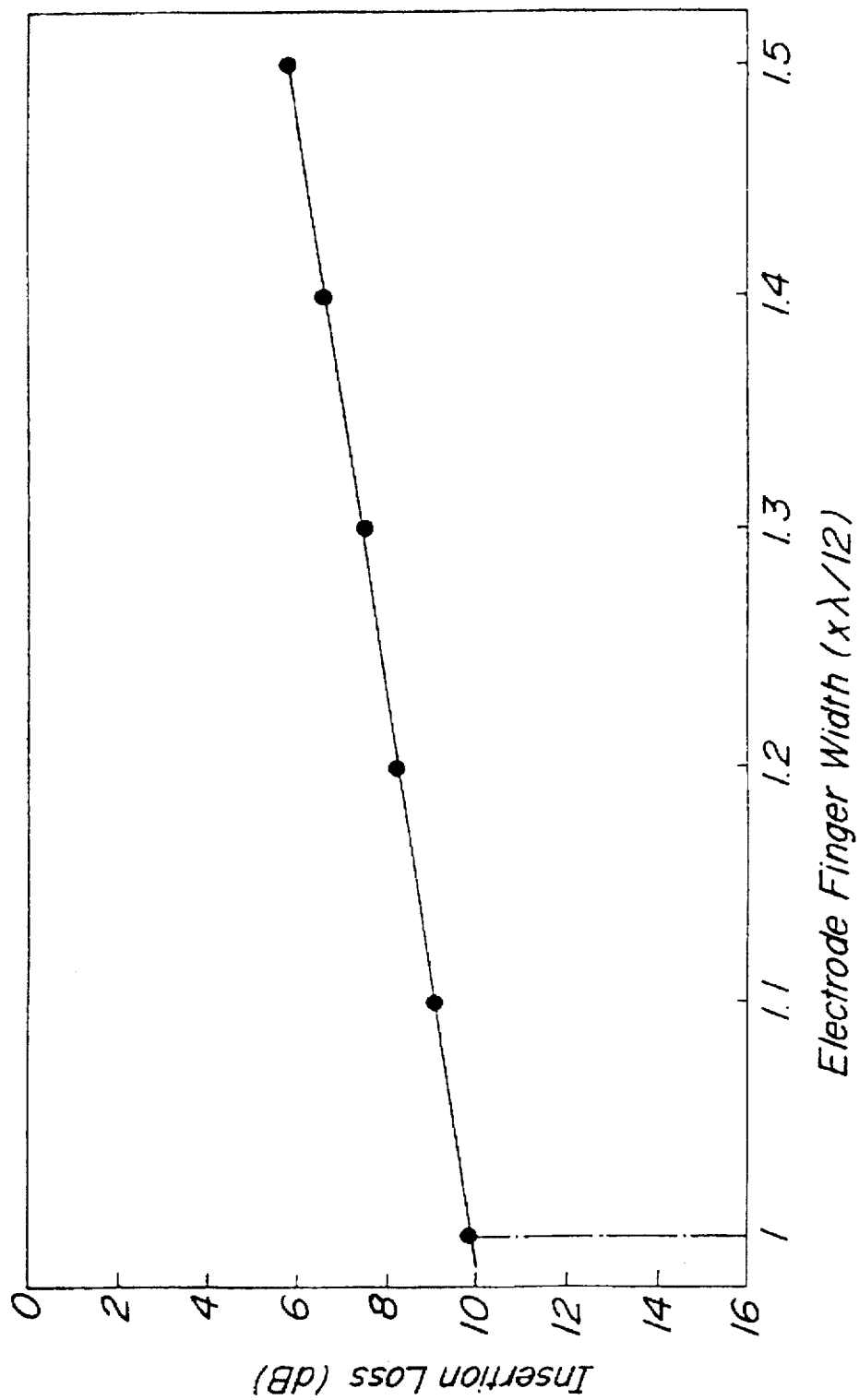
FIG. 3 is a graph showing the relationship between the electrode finger width and the insertion loss of the surface acoustic wave filter device.

The two-stage cascade connection type surface acoustic wave filter device provides a higher out-of-band attenuation degree, though the insertion loss of the device tends to increase. Hence it is desirable to form each transducer in such a manner as to enable reduction of the insertion loss to the extent possible. To this end, it is effective to increase the electrode finger width of the transducers and thereby positively utilize the mechanical perturbation effect. In order to fully ascertain the relationship between the electrode finger width and the insertion loss of the filter device, an experiment has been conducted using five samples of the surface acoustic wave filter device each having a center frequency of 240 MHz and different electrode finger widths. Each sample includes a quartz substrate and a two-stage cascade connection of the filter stages each provided with 350 pairs of electrodes. The result of this experiment is shown in FIG. 3, wherein the abscissa corresponds to the electrode finger width and the ordinate corresponds to the insertion loss of the device. It can be appreciated from FIG. 3 that a larger electrode finger width provides a smaller insertion loss.

The two-stage cascade connection type surface acoustic wave filter device has a higher out-of-band attenuation degree and a capability covering up to 10 dB by a one stage amplifier, so that the user's standard relating to the insertion loss in practical use is defined as not greater than 10 dB. In order to meet such requirement, it is desirable for the electrode ginger width "w" to be not less than $1.0 \times \lambda/12$.

Figure 4:
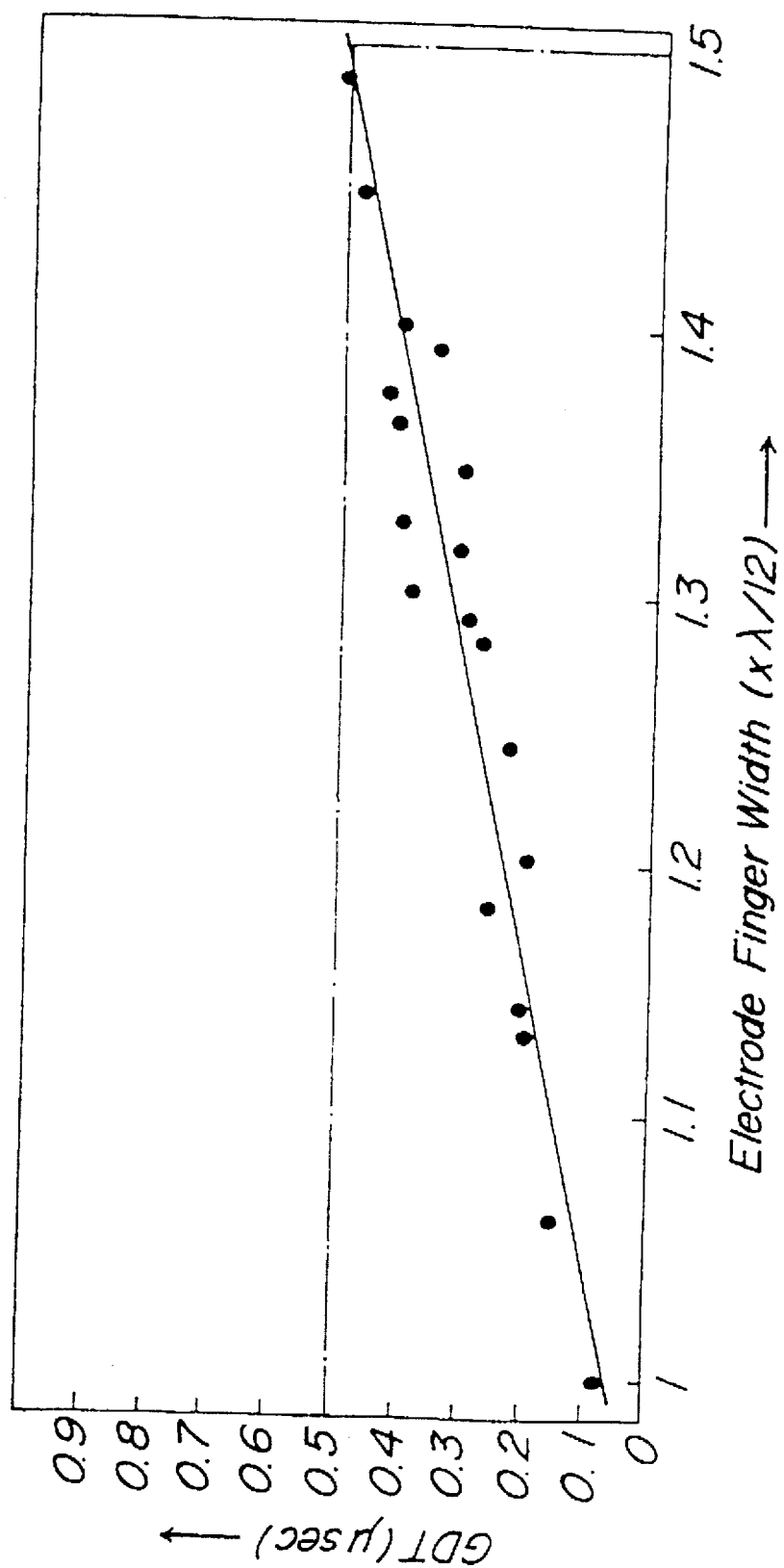
FIG. 4 is a graph showing the relationship between the electrode finger width and GDT characteristic of the surface acoustic wave filter device.

On the other hand, the GDT characteristic of the filter device tends to deteriorate with increase in the electrode finger width "W". In order to fully ascertain the relationship between the electrode finger width and the GDT characteristic of the filter device, an experiment has been conducted, the result of which is shown in FIG. 4. It can be appreciated from FIG. 4 that the GDT characteristic exhibits linear increases in accordance with increase in the electrode finger width. The user's standard for the GDT characteristic is defined to be not greater than 0.5 μsec, so that it is desirable for the electrode finger width "w" to be not greater than 1.5×λ/12.

In accordance with these considerations, it is desirable for the electrode finger width "w" to satisfy the following equations:

$$1.0 \times \lambda/12 \leq w < 1.5 \times \lambda/12$$

Explanation will now be made of warping of the quartz substrate of the surface acoustic wave filter device, as related to the manufacturing yield of the device. An experiment has been conducted with respect to two samples of substrate, i.e., a sample substrate $S_1$ having mirror-polished surfaces on both sides, and another sample substrate $S_2$ having a mirror-polished surface on one side and a rough surface on the other side. For these substrate samples, the amount of warping and deviation of the electrode finger width were measured, the result of which is shown in the following Table 1.

TABLE 1

|  | sample substrate $S_1$ | sample substrate $S_2$ |
| --- | --- | --- |
| warping amount (μm) | 30 to 40 | 60 to 70 |
| deviation of electrode finger width (μm) | 0.05 | 0.12 |

It can be appreciated from Table 1 that the sample substrate $S_1$ having mirror-polished surfaces on both sides exhibits a relatively small warping amount which is substantially 50% as compared to that of the sample substrate $S_2$ having a mirror-polished surface on one side and a grooved surface on the other side. As a result of reduced amount of warping, the sample substrate $S_1$ has a relatively small deviation of electrode finger width which is substantially 40% as compared to that of the sample substrate $S_2$. It is therefore clear that the mirror polishing on both sides of the substrate provides a highly improved manufacturing yield of the device.

Further explanation will be made of the two-stage cascade connection type surface acoustic wave filter device in connection with the bulk wave spurious noise. An experiment has been conducted with respect to two samples of surface acoustic wave filter device each having a substrate with mirror-polished surfaces on both sides, i.e., a sample filter device of the single stage type and another sample filter device of the two-stage cascade connection type. The sample filter device of the single stage type includes transducers with 400 electrode pairs, and the sample filter device of the two-stage cascade connection type includes transducers with 350 electrode pairs. Each sample filter device has a center frequency of 240 MHz and an electrode finger width "w" of 1.3×λ/12.

Figure 5:
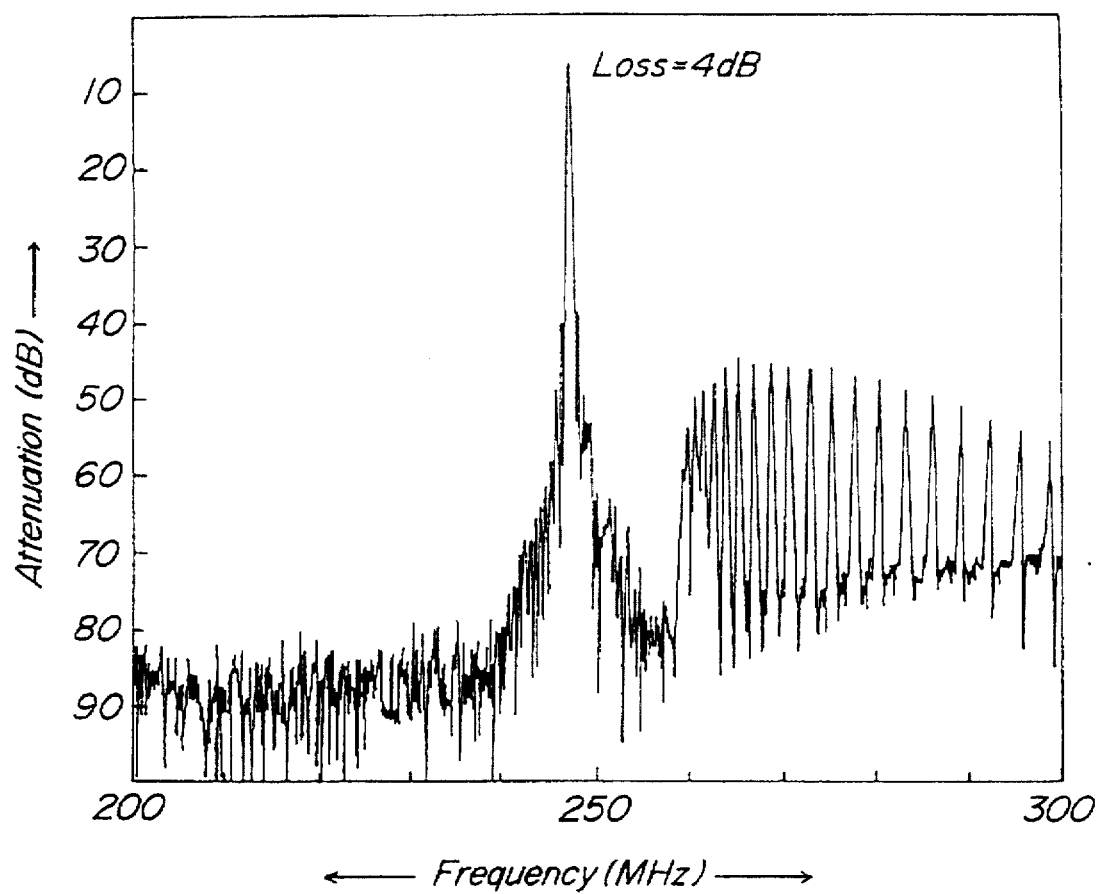
FIG. 5 is a graph showing the frequency characteristic of & surface acoustic wave filter device which includes a single filter stage.
Figure 6:
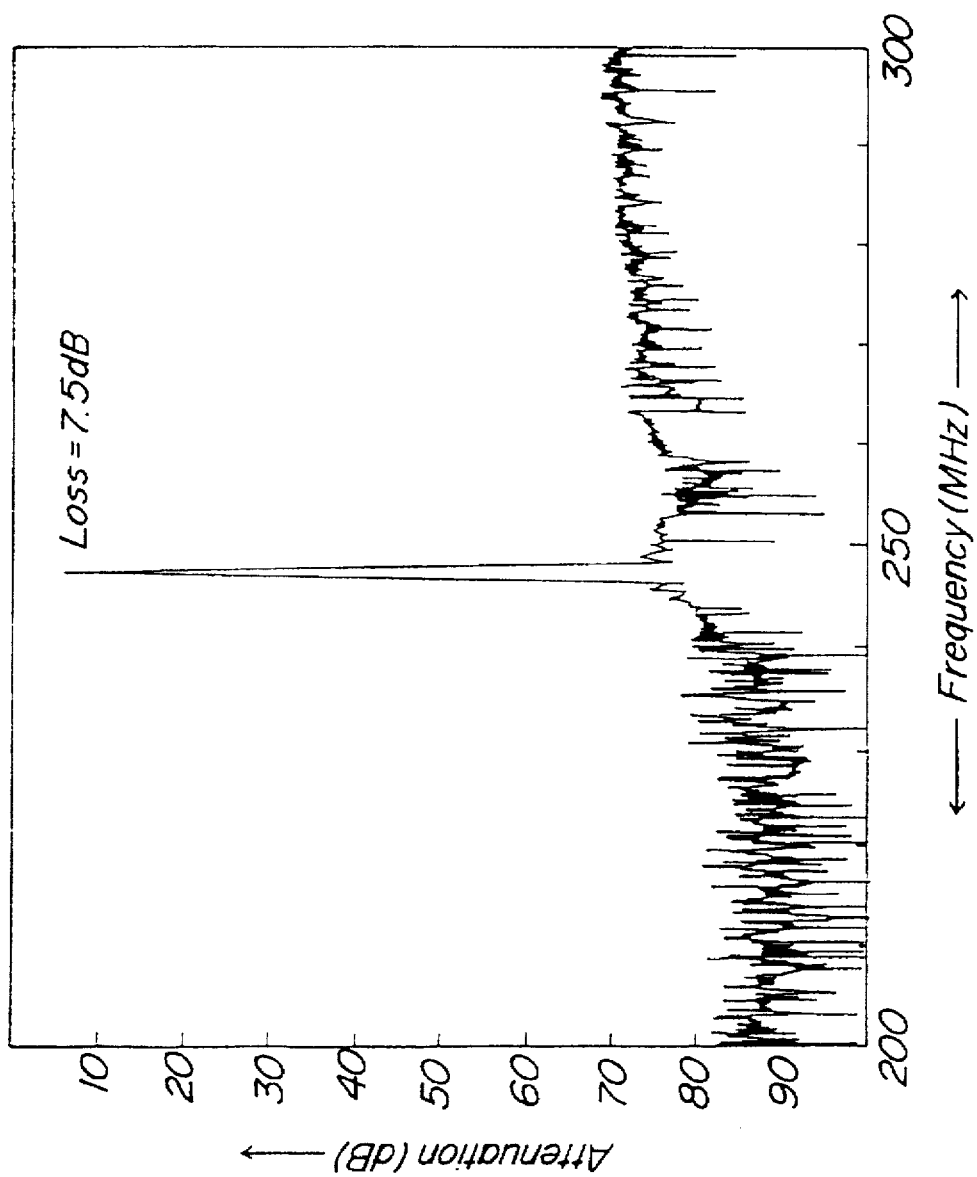
FIG. 6 is a graph showing the frequency characteristic of two-stage cascade connection type surface acoustic wave filter device according to the present invention.

FIG. 5 shows the frequency characteristic of the sample filter device of the single stage type, and FIG. 6 shows the frequency characteristic of the sample filter device of the two-stage cascade connection type. It can be appreciated from FIG. 5 that the sample filter device of the single stage type exhibits an insertion loss which is as low as 4 dB, though the bulk wave spurious noise is notable in the frequency range which is higher than the center frequency. It can be further appreciated from FIG. 6 that, although the sample filter device of the two-stage cascade connection type exhibits a relatively high insertion loss of 7.5 dB, the bulk wave spurious noise has been significantly reduced. Such a comparison clearly reveals that the two-stage cascade connection type surface acoustic wave filter device in accordance with the present invention is capable of significantly mitigating the adverse effect of the bulk wave spurious noise, even when the back surface of the substrate has not been subjected to surface roughening or groove formation.

It can be appreciated from the foregoing detailed description that the embodiment shown in FIG. 2 is particularly advantageous in that the cascade connection of the two filter stages serves to significantly mitigate the adverse effect of the bulk wave spurious noise, while the piezoelectric substrate with mirror-polished surfaces on both sides serves to reduce the warping amount of the substrate thereby highly improving the manufacturing yield of the device. Moreover, the positive electrode of the input side transducer of the first filter stage and the positive electrode of the output side transducer of the second filter stage are arranged at respective locations which are spaced each other by an increased distance. It is thus possible to prevent an electromagnetic coupling between these transducers, thereby realizing an advanced surface acoustic wave filter device having a satisfactory frequency characteristic with a highly improved out-of-band attenuation characteristic.

Further embodiments of the present invention will be briefly explained below with reference to FIGS. 7 and 8, which ere basically same in construction as the previous embodiment. For the sake of convenience, the same or corresponding elements are denoted by the same reference numerals in order to avoid superfluous description.

Figure 7:
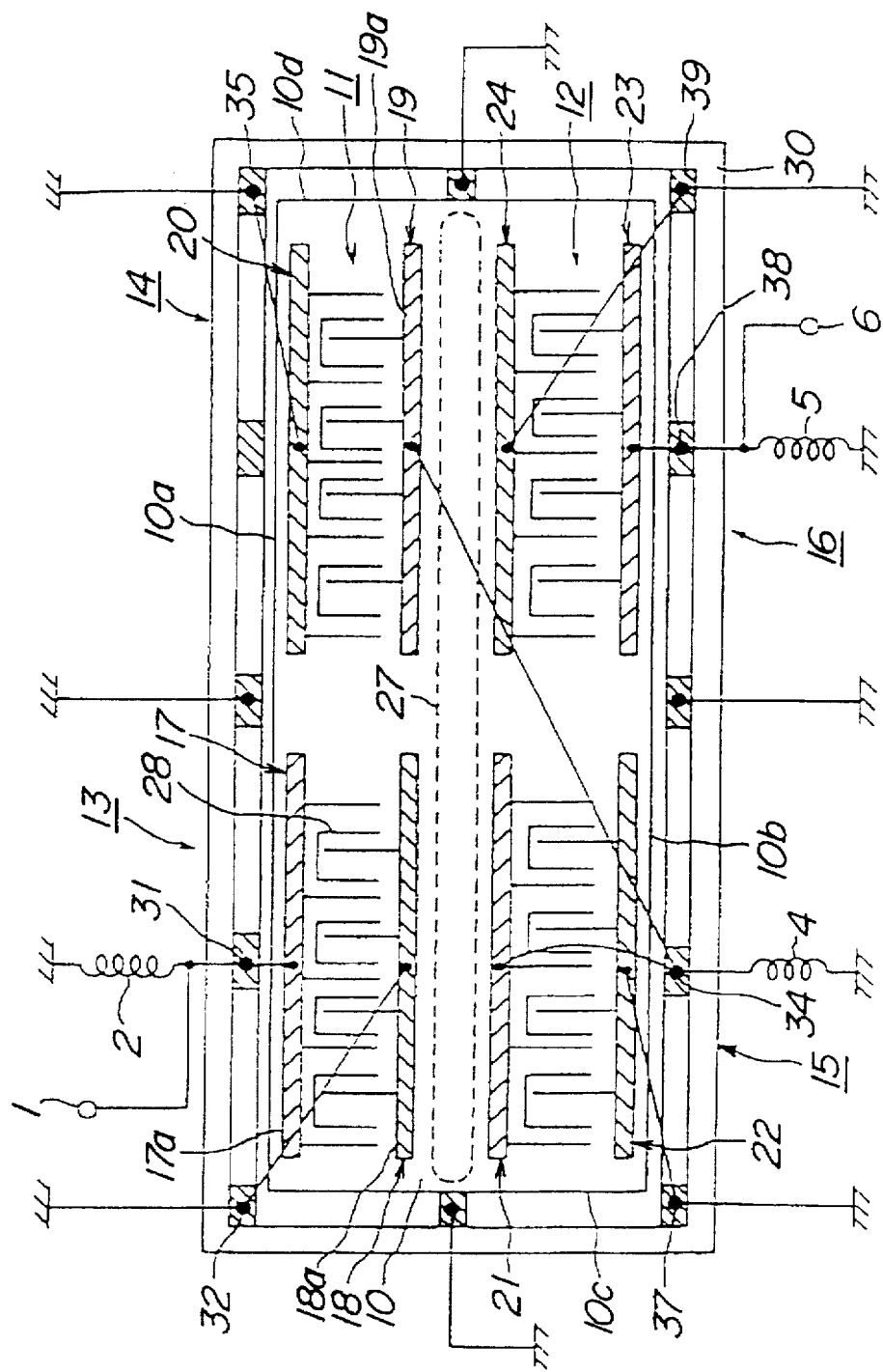
FIGS. 7 and 8 are schematic plan views showing alternative embodiments of the surface acoustic wave filter device according to the invention.

The embodiment shown in FIG. 7 differs from the previous embodiment in the arrangement of the bonding pads provided for the package 30. That is to say, the package 30 includes four bonding pads 32, 35, 37, 39 which are arranged at the four corners of the package 30. The bus bars 18a, 20a of the negative electrodes 18, 20 of the input side and output side transducers 13, 14 of the first filter stage 11 are connected to the bonding pads 32, 35, respectively. Similarly, the bus bars of the negative electrodes 22, 24 of the input side and output side transducers 15, 16 of the second filter stage 11 are connected to the bonding pads 37, 39, respectively.

In the embodiment shown in FIG. 7, furthermore, the input side and output side transducers 13–16 of the first and second filter stages 11, 12 each includes the positive and negative electrode fingers and associated bus bars, which are formed of an aluminum thin film. The aluminum thin film can be readily formed on the substrate by a process including vapor deposition, photo-lithography and etching steps, in a manner known, per se. In this instance, the bus bar has a thickness which is greater than the thickness of the electrode fingers. Preferably, the thickness of each bus bar is not less than 0.3 μm and not greater than 0.7 μm, and is two to four times greater than the thickness of the electrode fingers.

Figure 8:
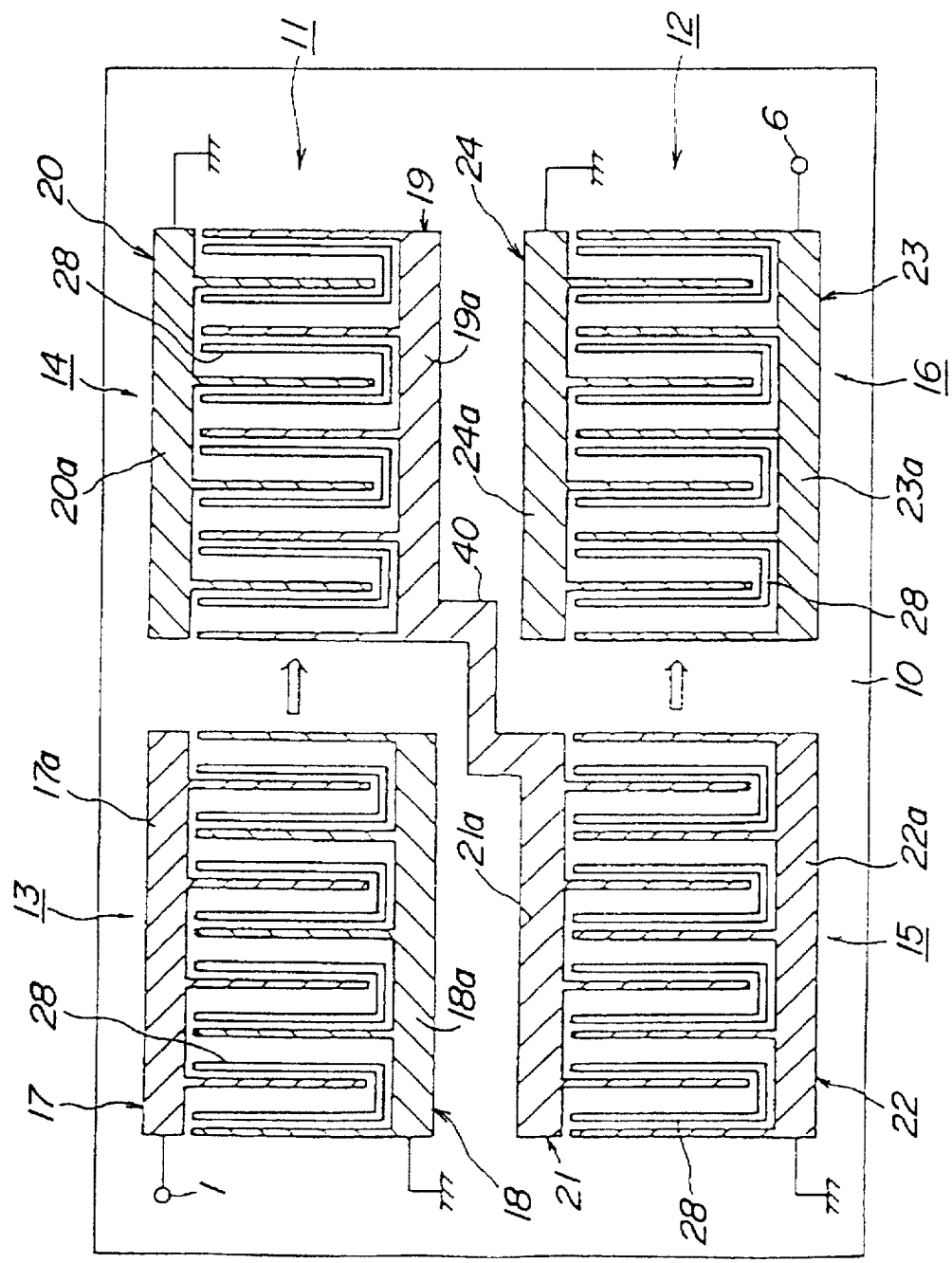

The embodiment shown in FIG. 8 includes the input side and output side transducers 13–16 of the first and second filter stages 11, 12, wherein the transducers 13–16 include the positive and negative electrode fingers and associated bus bars 17a, 18a, 19a, 20a, 21a, 22a, 23a, 24a, which are formed of an aluminum thin film as in the embodiment of FIG. 7. In this instance, the bus bar 19a of the positive electrode 19 of the output side transducer 14 of the first filter stage 11 and the bus bar 21a of the positive electrode 21 of the input side transducer 15 of the second filter stage 12 are conected with each other by a conductive pattern 40 which is formed on the piezoelectric substrate 10. The bus bars 19a, 21a and the conductive pattern 40 have a thickness which is greater than the thickness of the electrode fingers. Preferably, in this embodiment also, the thickness of the bus bars 19a, 22a and the conductive pattern 40 is not less than 0.3 μm and not greater than 0.7 μm, and is two to four times greater than the thickness of the electrode fingers.

In the embodiments shown in FIGS. 7 and 8, the thickness of the bus bars 17a–24a and the conductive pattern 40, as the case may be, is primarily determined for the reasons as follows. That is to say, it is desirable for the bus bars 17a–24a and the conductive pattern 40 to have an increased thickness so as to reduce the resistance value of the bus bars and lower the insertion loss of the surface acoustic wave filter device. Thus, the thickness of the bus bars 17a–24a and the conductive pattern 40 should be not less than 0.3 μm which is approximately twice the thickness of the electrode fingers. On the other hand, however, an excessive thickness of the bus bars 17a–24a and the conductive pattern 40 tends to enhance a reflection of the surface acoustic wave at the bus bars, which is superimposed on the surface acoustic wave transmitted from the input side transducer directly toward the output side transducer, thereby generating a ripple noise. Thus, the thickness of the bus bars 17a–24a and the conductive pattern 40 should be not greater than 0.7 m which is approximately four times the thickness of the electrode fingers. It has been confirmed that the thickness of the bus bars 17a–24a and the conductive pattern 40 within a range of 0.3–0.7 μm, i.e., two to four times of the thickness of the electrode fingers, provide a sufficiently reduced resistance and insertion loss of the device, without causing notable ripple noise.

It should be noted that the embodiments shown in FIGS. 7 and 8 may be applied to a piezoelectric substrate having a back surface which is not a mirror-polished surface, provided that such back surface is a flat surface which is substantially free from unevenness.

Figure 9:
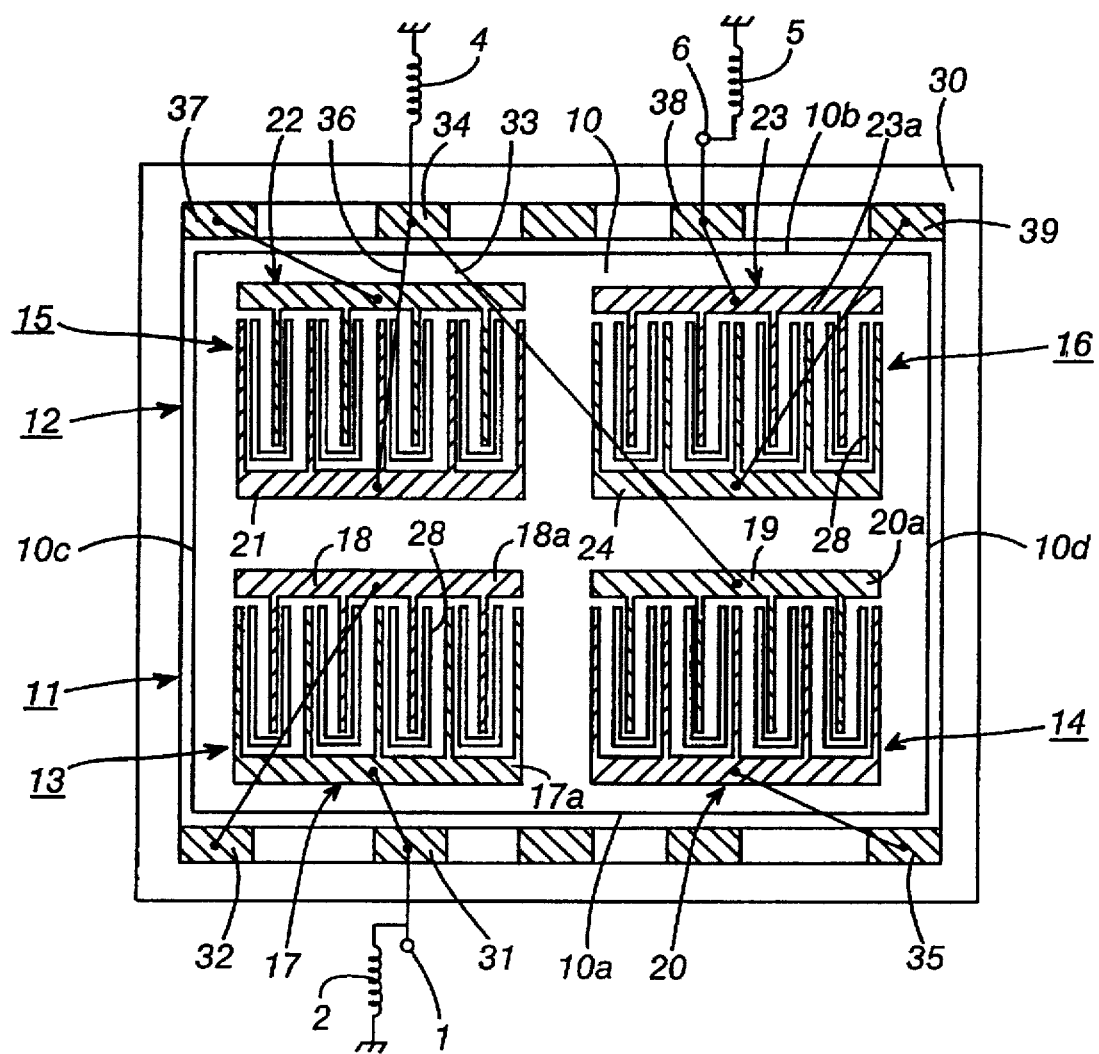
FIG. 9 is a schematic plan view showing further modified embodiment of the surface acoustic wave filter device according to the present invention.

There is shown in FIG. 9 a further modified embodiment of the surface acoustic wave filter device according to the present invention, which is basically the same as the embodiment of FIG. 2. The essential difference resides in that, in the present embodiment, the bus bars of the negative electrodes of the input side and output side transducers are connected to the respective bonding pads 32, 35, 37, 39 at the four corners of the package 30, and these bonding pads 32, 35, 37, 39 are connected to the earth through ground terminals of the package 30. Such an arrangement serves to stabilize the potential distribution of the package as a whole, and thereby to significantly improve the out-of-band attenuation characteristic of the device.

Furthermore, the present invention is not limited to the specific embodiments as hereinbefore described, and various modifications and changes can be made without departing from the scope of the invention. For example, the surface acoustic wave filter device according to the present invention may include known unidirectional transducers having an electrode arrangement which is different from that of the illustrated embodiments.

Also, it is not always necessary to provide the same number of electrode pairs for all the transducers of the first and second filter stages. A balanced arrangement of the surface acoustic wave filter device can be realized provided that the output side transducer of the first filter stage and the input side transducer of the second filter stage include the same number of electrode pairs. Specifically, a satisfactory performance of the surface acoustic wave filter device can be achieved by providing the same number of electrode pairs for the output side transducer of the first filter stage and the input side transducer of the second filter stage, a different number of electrode pairs for the input side transducer of the first filter stage and a further different number of electrode pairs for the output side transducer of the second filter stage.

We claim:

1. A surface acoustic wave filter device comprising:

a piezoelectric substrate having first and second surfaces opposite to each other, each of said first and second surfaces being mirror-polished; and first and second filter stages formed on the first surface of the piezoelectric substrate, respectively, each having an interdigital-type unidirectional input side transducer and an interdigital-type unidirectional output side transducer;

said input side and output side transducers of the first and second filter stages being arranged so that surface acoustic waves transmitted from the input side transducers propagate toward the respective output side transducers in a predetermined common direction along respective propagation axes which are in parallel with each other;

said input side and output side transducers of the first and second filter stages each including at least a positive electrode having a plurality of electrode fingers, and a negative electrode having a plurality of electrode fingers which are arranged between adjacent electrode fingers of the positive electrode, the positive electrode of the output side transducer of the first filter stage and the positive electrode of the input side transducer of the second filter stage being connected with each other.

2. The surface acoustic wave filter device according to claim 1, wherein each of said input side and output side transducers of the first and second filter stages includes said positive electrode having said plurality of electrode fingers which are arranged at a pitch $\lambda$, where $\lambda$ is a wavelength of a fundamental surface acoustic wave, said negative electrode having said plurality or electrode fingers which are arranged at a pitch $\lambda$ and positioned at a center distance $\lambda/2$ with respect to an adjacent electrode finger of the positive electrode, and a floating electrode having a plurality of electrode fingers each being arranged between adjacent electrode fingers of the positive and negative electrodes and offset from an intermediate position between the adjacent electrode fingers of the positive and negative electrodes, in a direction opposite to the propagation direction of the surface acoustic wave in the case of the floating electrode of the input side transducers, and in the propagation direction of the surface acoustic wave in the case of the floating electrode of the output side transducers.

3. The surface acoustic wave filter device according to claim 2, wherein each electrode finger of the floating electrode of the input side and output side transducers of each filter stage is positioned spaced from an intermediate position between an adjacent electrode finger of the positive electrode and an adjacent electrode linger of the negative electrode finger, by a distance $\lambda/12$ in the direction opposite to the propagation direction of the surface acoustic wave in the case of the floating electrode of the input side transducers, and by a distance $\lambda/12$ in the propagation direction off the surface acoustic wave in the case of the floating electrode of the output side transducers, and wherein each electrode finger of the positive electrodes, negative electrodes and floating electrodes of the input side and output side transducers of each filter stage has a width "w" as measured in the propagation direction of the surface acoustic wave, said width satisfying the following equation:

$$1.0 \times \lambda/12 \leq w < 1.5 \times \lambda/12.$$

4. The surface acoustic wave filter device according to claim 2, wherein the piezoelectric substrate is formed of quartz or a piezoelectric material having an electromechanical coupling factor which is substantially the same as that of quartz, and the floating electrode of the input side and output side transducers of each filter stage is a short-circuit-type floating electrode.

5. The surface acoustic wave filter device according to claim 1, wherein the input side transducer of the first filter stage has a bus bar of the positive electrode, which is directly opposite to a first side edge of the piezoelectric substrate, and the output side transducer of the second filter stage has a bus bar of the positive electrode, which is directly opposite to a second side edge of the piezoelectric substrate, said first and second side edges being opposite to each other.

6. The surface acoustic wave filter device according to claim 1, wherein a guard electrode is arranged between the first and second filter stages, so as to prevent an electromagnetic coupling of the transducers of the first filter stage with the transducers of the second filter stage.

7. The surface acoustic wave filter device according to claim 1, wherein a sound absorbing material layer is formed between the first and second filter stages so that a surface acoustic wave transmitted from the input side transducer of one of the filter stages is prevented from being received by the output side transducer of the other of the filter stages.

8. The surface acoustic wave filter device according to claim 1, wherein the positive electrode of the output side transducer of the first filter stage and the positive electrode of the input side transducer of the second filter stage are connected with each other by at least one bonding wire.

9. The surface acoustic wave filter device according to claim 8, further comprising a package containing the piezoelectric substrate therein and having a bonding pad which is connected, by first and second bonding wires, respectively, to the positive electrode of the output side transducer of the first filter stage and the positive electrode of the input side transducer of the second filter stage.

10. The surface acoustic wave filter device according to claim 9, wherein said bonding pad is positioned on a substantially intermediate point of the package in the propagation direction of the surface acoustic wave.

11. The surface acoustic wave filter device according to claim 9, wherein the positive electrode of each transducer of each filter stage has a bus bar, and wherein said first and second bonding wires are coupled to an intermediate point, in the propagation direction of the surface acoustic wave, of the bus bar of each positive electrode.

12. The surface acoustic wave filter device according to claim 9, wherein said bonding pad is positioned on a substantially intermediate point of the package in the propagation direction of the surface acoustic wave, and wherein said first and second bonding wires have substantially the same length.

13. The surface acoustic wave filter device according to claim 1, wherein said substrate has at least one edge having a microscopic unevenness.

14. The surface acoustic wave filter device according to claim 1, wherein said substrate has at least one edge provided with a sound absorbing material layer.

15. A surface acoustic wave filter device comprising:
a piezoelectric substrate having first and second surfaces opposite to each other, each of said first and second surfaces being mirror-polished; and
first and second filter stages formed on the first surface of the piezoelectric substrate, respectively, each having a unidirectional input side transducer and a unidirectional output side transducer;
said input side and output side transducers of the first and second filter stages being arranged so that surface acoustic waves transmitted from the input side transducers propagate toward the respective output side transducers in a predetermined common direction along respective propagation axes which are in parallel with each other;
said input side and output side transducers of the first and second filter stages each including at least a positive electrode having a plurality of electrode fingers connected by a bus bar, and a negative electrode having a plurality of electrode fingers connected by a bus bar which are arranged between adjacent electrode fingers of the positive electrode, the positive electrode of the output side transducer of the first filter stage and the positive electrode of the input side transducer of the second filter stage being connected with each other;
said electrode fingers and bus bars of each transducer being formed of an aluminum thin film, said bus bars having a thickness which is greater than the thickness of the electrode fingers.

16. The surface acoustic wave filter device according to claim 15, wherein each of said input side and output said transducers of the first and second filter stages includes said positive electrode having said plurality of electrode fingers arranged at a pitch $\lambda$, where $\lambda$ is a wavelength of a fundamental surface acoustic wave, said negative electrode having said plurality of electrode fingers which are arranged at a pitch $\lambda$ and positioned at a center distance $\lambda/2$ with respect to an adjacent electrode finger of the positive electrode, and a floating electrode having a plurality of electrode fingers each being arranged between adjacent electrode fingers of the positive and negative electrodes and offset from an intermediate position between the adjacent electrode fingers of the positive and negative electrodes, in a direction opposite to the propagation direction of the surface acoustic wave in the case of the floating electrode of the input side transducers, and in the propagation direction of the surface acoustic wave in the case of the floating electrode of the output side transducers.

17. The surface acoustic wave filter device according to claim 15, wherein each bus bar has a thickness which is at least 0.3 μm.

18. The surface acoustic wave filter device according to claim 17, wherein each bus bar has a thickness which is not greater than 0.7 μm.

19. The surface acoustic wave filter device according to claim 15, wherein each bus bar has a thickness which is at least twice the thickness of the electrode fingers.

20. The surface acoustic wave filter device according to claim 15, wherein each bus bar has a thickness which is two to four times greater than the thickness of the electrode fingers.

21. A surface acoustic wave filter device comprising:
a piezoelectric substrate having first and second surfaces opposite to each other, each of said first and second surfaces being mirror-polished; and
a package containing the piezoelectric substrate therein and having four corners which are provided with first, second, third and fourth bonding pads, respectively;
first and second filter stages formed on the first surface of the piezoelectric substrate, respectively, each having a unidirectional input side transducer and a unidirectional output side transducer;

said input side and output side transducers of the first and second filter stages being arranged so that surface acoustic waves transmitted from the input side transducers propagate toward the respective output side transducers in a predetermined common direction along respective propagation axes which are in parallel with each other;

said input side and output side transducers of the first and second filter stages each including at least a positive electrode having a plurality of electrode fingers, and a negative electrode having a plurality of electrode fingers which are arranged between adjacent electrode fingers of the positive electrode, the positive electrode of the output side transducer of the first filter stage and the positive electrode of the input side transducer of the second filter stage being connected with each other, said positive and negative electrodes of said input side and output side transducers of the first and second filter stages each including a bus bar extending in said predetermined direction and connecting the respective electrode fingers with each other;

said bus bars of the negative electrodes of the input side and output side transducers of the first filter stage being connected to the first and second bonding pads of the package, respectively, and said bus bars of the negative electrodes of the input side and output side transducers of the second filter stage being connected to the third and fourth bonding pads of the package, respectively.

22. The surface acoustic wave filter device according to claim 21, wherein each of said input side and output side transducers of the first and second filter stages each includes said positive electrode having said plurality of electrode fingers which are arranged at a pitch λ, where λ is a wavelength of a fundamental surface acoustic wave, said negative electrode having said plurality of electrode fingers which are arranged at a pitch λ and positioned at a center distance λ/2 with respect to an adjacent electrode finger of the positive electrode, and a floating electrode having a plurality of electrode fingers each being arranged between adjacent electrode fingers of the positive and negative electrodes and offset from an intermediate position between the adjacent electrode fingers of the positive and negative electrodes, in a direction opposite to the propagation direction of the surface acoustic wave in the case of the floating electrode of the input side transducers, and in the propagation direction of the surface acoustic wave in the case of the floating electrode of the output side transducers.

23. The surface acoustic wave filter device according to claim 21, wherein said package further comprises a fifth bonding pad which is connected, by first and second bonding wires, respectively, to the positive electrode of the output side transducer of the first filter stage and the positive electrode of the input side transducer of the second filter stage.

24. The surface acoustic wave filter device according to claim 23, wherein said fifth bonding pad is positioned at an intermediate point of the package in the propagation direction of the surface acoustic wave.

25. The surface acoustic wave filter device according to claim 24, wherein said first and second bonding wires are coupled to an intermediate point, in the propagation direction of the surface acoustic wave, of the bus bar of each positive electrode.

26. The surface acoustic wave filter device according to claim 25, wherein said first and second bonding wires have substantially the same length.

27. A surface acoustic wave filter device comprising:
a piezoelectric substrate having first and second surfaces opposite to each other, each of said first and second surfaces being mirror-polished; and first and second filter stages formed on the first surface of the piezoelectric substrate, respectively, each having a unidirectional input side transducer and a unidirectional output side transducer;

said input side and output side transducers of the first and second filter stages being arranged so that surface acoustic waves transmitted from the input side transducers propagate toward the respective output side transducers in a predetermined common direction along respective propagation axes which are in parallel with each other;

said input side and output side transducers of the first and second filter stages each including at least a positive electrode having a plurality of electrode fingers connected by a bus bar, and a negative electrode having a plurality of electrode fingers connected by a bus bar which are arranged between adjacent electrode fingers of the positive electrode, the positive electrode of the output side transducer of the first filter stage and the positive electrode of the input side transducer of the second filter stage being connected with each other;

said electrode fingers and bus bars of each transducer being formed of an aluminum thin film, the bus bar of the positive electrode of the output side transducer of the first filter stage and the bus bar of the positive electrode of the input side transducer of the second filter stage being connected with each other by a conductive pattern formed of an aluminum film on said first surface of the substrate, said bus bars and conductive pattern having a thickness which is greater than that of said electrode fingers.

28. The surface acoustic wave filter device according to claim 27, wherein each of said input side and output side transducers of the first and second filter stages includes said positive electrode having said plurality of electrode fingers which are arranged at a pitch λ, where λ is a wavelength of a fundamental surface acoustic wave, said negative electrode having said plurality of electrode fingers which are arranged at a pitch λ and positioned at a center distance λ/2 with an adjacent electrode finger of the positive electrode, and a floating electrode having a plurality of electrode fingers each being arranged between adjacent electrode fingers of the positive and negative electrodes and offset from an intermediate position between the adjacent electrode fingers of the positive and negative electrodes, in a direction opposite to the propagation direction of the surface acoustic wave in the case of the floating electrode of the input side transducers, and in the propagation direction of the surface acoustic wave in the case of the floating electrode of the output side transducers.

29. The surface acoustic wave filter device according to claim 27, wherein said bus bars and conductive pattern have a thickness which is at least 0.3 μm.

30. The surface acoustic wave filter device according to claim 29, wherein said bus bars and conductive pattern have a thickness which is not greater than 0.7 μm.

31. The surface acoustic wave filter device according to claim 27, wherein said bus bars and conductive pattern have a thickness which is at least twice the thickness of the electrode fingers.

32. The surface acoustic wave filter device according to claim 27, wherein said bus bars and conductive pattern have a thickness which is two to four times greater than the thickness of the electrode fingers.

* * * * *

UNITED STATES PATENT AND TRADEMARK OFFICE
CERTIFICATE OF CORRECTION

PATENT NO. : 5,710,529
DATED : January 20, 1998
INVENTOR(S) : Masahiko SUGIYAMA; Yasufumi HORIO; Masatsugu OSHIMA; and Kenji SUZUKI It is certified that error appears in the above-identified patent and that said Letters Patent is hereby corrected as shown below:

Column 1, line 1, & on the title page, item [54], line 1, change "FILER" to --FILTER--.

Signed and Sealed this

Third Day of March, 1998

Attest:

BRUCE LEHMAN

Attesting Officer

Commissioner of Patents and Trademarks